US012586760B2

(12) United States Patent
Mori et al.

(10) Patent No.: US 12,586,760 B2
(45) Date of Patent: Mar. 24, 2026

(54) PLASMA PROCESSING APPARATUS AND PLASMA PROCESSING METHOD

(71) Applicant: Hitachi High-Tech Corporation, Tokyo (JP)

(72) Inventors: Isao Mori, Tokyo (JP); Ryosuke Ochiai, Tokyo (JP)

(73) Assignee: Hitachi High-Tech Corporation, Tokyo (JP)

( * ) Notice: Subject to any disclaimer, the term of this patent is extended or adjusted under 35 U.S.C. 154(b) by 0 days.

(21) Appl. No.: 17/908,321

(22) PCT Filed: Aug. 23, 2021

(86) PCT No.: PCT/JP2021/030735
§ 371 (c)(1),
(2) Date: Aug. 31, 2022

(87) PCT Pub. No.: WO2023/026317
PCT Pub. Date: Mar. 2, 2023

(65) Prior Publication Data
US 2024/0212984 A1      Jun. 27, 2024

(51) Int. Cl.
H01J 37/32 (2006.01)
H01L 21/67 (2006.01)

(52) U.S. Cl.
CPC .. *H01J 37/32174* (2013.01); *H01J 37/32128* (2013.01); *H01J 37/32715* (2013.01);
(Continued)

(58) Field of Classification Search
CPC ........... H01J 37/32128; H01J 37/32174; H01J 37/32091; H01J 37/32; H01L 21/3065
See application file for complete search history.

(56) References Cited

U.S. PATENT DOCUMENTS 7,250,091 B2      7/2007   Gupta et al.
7,869,526 B2      1/2011   Maxwell et al.
(Continued)

FOREIGN PATENT DOCUMENTS

JP          H08181118 A         7/1996
JP          2010-103465 A       5/2010
(Continued)

OTHER PUBLICATIONS

Search Report mailed Sep. 10, 2019, in International Application No. PCT/JP2019/030660.
(Continued)

*Primary Examiner* — Patrick C Chen
(74) *Attorney, Agent, or Firm* — Miles & Stockbridge, P.C.

(57) ABSTRACT

A high-precision plasma processing apparatus configured with: a processing chamber in which a sample undergoes plasma processing; a first radio frequency power supply that supplies radio frequency power for plasma generation; a sample stage on which a sample is loaded; a second radio frequency power supply that supplies radio frequency power to the sample stage; a power supply that applies voltage to the sample stage; and a control unit that controls the power supply. In the plasma processing apparatus, a cycle of a waveform of the voltage has a positive ramp period during which the voltage rises, a negative ramp period during which the voltage falls, and a removal amount control period during which the amount of charged particles removed from the sample per unit time is controlled.

10 Claims, 12 Drawing Sheets

(52) U.S. Cl.
  CPC . *H01J 2237/2007* (2013.01); *H01J 2237/327*
      (2013.01); *H01L 21/67069* (2013.01)

(56) References Cited

U.S. PATENT DOCUMENTS

| | | | |
|---|---|---|---|
| 10,431,428 | B2 | 10/2019 | Bhutta et al. |
| 10,734,196 | B2 | 8/2020 | Morii et al. |
| 10,755,897 | B2 | 8/2020 | Ikeda et al. |
| 10,778,209 | B1 | 9/2020 | Morii et al. |
| 10,812,071 | B2 | 10/2020 | Morii et al. |
| 10,985,735 | B2 | 4/2021 | Morii |
| 11,050,400 | B2 | 6/2021 | Morii |
| 11,101,109 | B2 | 8/2021 | Morii |
| 11,218,129 | B2 | 1/2022 | Morii |
| 11,309,164 | B2 | 4/2022 | Taniguchi et al. |
| 11,329,614 | B2 | 5/2022 | Kotani |
| 11,348,762 | B2 | 5/2022 | Morii |
| 11,387,078 | B2 | 7/2022 | Morii |
| 11,525,946 | B2 | 12/2022 | Shklover |
| 11,527,385 | B2 | 12/2022 | Maw et al. |
| 11,531,312 | B2 | 12/2022 | Coumou et al. |
| 11,536,755 | B2 | 12/2022 | Fisk, II et al. |
| 11,545,340 | B2 | 1/2023 | An et al. |
| 11,545,342 | B2 | 1/2023 | Ni et al. |
| 11,545,954 | B2 | 1/2023 | Morii |
| 11,552,612 | B2 | 1/2023 | Morii |
| 11,561,089 | B2 | 1/2023 | Yamada et al. |
| 11,569,065 | B2 | 1/2023 | Kang et al. |
| 11,569,066 | B2 | 1/2023 | Cubaynes et al. |
| 11,594,400 | B2 | 2/2023 | Bise et al. |
| 11,594,428 | B2 | 2/2023 | Tran et al. |
| 11,596,309 | B2 | 3/2023 | Oliveti et al. |
| 11,605,527 | B2 | 3/2023 | De Chambrier et al. |
| 11,615,941 | B2 | 3/2023 | Brouk et al. |
| 11,615,942 | B2 | 3/2023 | Huang et al. |
| 11,637,002 | B2 | 4/2023 | Singh et al. |
| 11,651,966 | B2 | 5/2023 | Kartik et al. |
| 11,657,980 | B1 | 5/2023 | Poghosyan et al. |
| 2007/0237208 | A1 | 10/2007 | Maxwell et al. |
| 2010/0072172 | A1 | 3/2010 | Ui et al. |
| 2012/0052689 | A1 | 3/2012 | Tokashiki |
| 2012/0228263 | A1 | 9/2012 | Ui et al. |
| 2012/0247677 | A1 | 10/2012 | Himori et al. |
| 2013/0106421 | A1 | 5/2013 | Dubourg et al. |
| 2014/0011365 | A1 | 1/2014 | Yasui et al. |
| 2014/0275116 | A1 | 9/2014 | Hogan, II |
| 2015/0126037 | A1 | 5/2015 | Chen et al. |
| 2015/0162223 | A1 | 6/2015 | Ui et al. |
| 2016/0240427 | A1 | 8/2016 | Lee et al. |
| 2017/0110296 | A1 | 4/2017 | Himori et al. |
| 2017/0301516 | A1 | 10/2017 | Bhutta et al. |
| 2018/0082821 | A1 | 3/2018 | Ikeda et al. |
| 2018/0226227 | A1 | 8/2018 | Donnelly et al. |
| 2019/0088452 | A1 | 3/2019 | Yamada et al. |
| 2019/0108976 | A1 | 4/2019 | Van Zyl |
| 2019/0115193 | A1 | 4/2019 | Yasui et al. |
| 2019/0237300 | A1 | 8/2019 | Ikeda et al. |
| 2020/0144031 | A1 | 5/2020 | Tamamushi et al. |
| 2020/0211823 | A1 | 7/2020 | Hisatomi et al. |
| 2020/0279719 | A1 | 9/2020 | Yamada et al. |
| 2020/0286715 | A1 | 9/2020 | Ikeda et al. |
| 2021/0043424 | A1* | 2/2021 | Mori .......................... H05H 1/46 |
| 2022/0020576 | A1* | 1/2022 | Torii ................. H01J 37/32642 |

FOREIGN PATENT DOCUMENTS

| | | | | |
|---|---|---|---|---|
| JP | | 2012054534 | A | 3/2012 |
| JP | | 2012169542 | A | 9/2012 |
| JP | | 2012216608 | A | 11/2012 |
| JP | | 2020-077862 | A | 5/2020 |
| JP | | 2020-109838 | A | 7/2020 |
| KR | 10-2012-0037506 | A | | 4/2012 |
| KR | 20150123209 | A | | 11/2015 |
| KR | 10-2021-0018178 | A | | 2/2021 |
| WO | WO-2020100357 | A1 * | 5/2020 | ........ H01J 37/32128 |

OTHER PUBLICATIONS

Written Opinion mailed Sep. 10, 2019, in International Application No. PCT/JP2019/030660.

Office Action mailed May 27, 2021 on Korean Application No. 10-2020-7009882.

Office Action mailed Jul. 28, 2021 in U.S. Appl. No. 16/959,099.

Allowance mailed Apr. 12, 2022 in U.S. Appl. No. 16/959,099.

Search Report mailed Sep. 28, 2021 in International Application No. PCT/JP2021/030735.

Written Opinion mailed Sep. 28, 2021 in International Application No. PCT/JP2021/030735.

Office Action mailed Jun. 5, 2023 in U.S. Appl. No. 17/861,515.

Office Action mailed Nov. 28, 2024 in Korean Application No. 10-2022-7023359.

* cited by examiner (a)

(b)

PLASMA PROCESSING APPARATUS AND PLASMA PROCESSING METHOD

TECHNICAL FIELD

The present invention relates to a plasma processing apparatus and a plasma processing method.

BACKGROUND ART

The manufacturing process of semiconductor devices is mainly divided into processes for deposition, lithography, and etching. In the deposition process, a film of materials for structures to be built is formed on a wafer. Typical deposition methods include chemical-vapor deposition. In the lithography process, a resist applied on the deposited material is partially irradiated with ultraviolet light by an exposure apparatus. A place to be irradiated with the ultraviolet light is determined according to a pattern to be formed. Subsequently, development is performed to remove a portion of the resist and thus the place where the deposited material is exposed appears. In the etching process, the exposed material is removed to produce a desired structure. In this process, a plasma etching apparatus is used. This is an apparatus for allowing plasma formed inside the apparatus to react with the exposed material in order to remove the material. These processes are repeated to fabricate an integrated circuit.

The plasma etching apparatus is important because it plays a part in the main process for manufacturing semiconductor devices as described above. The operation of the plasma etching apparatus is described in detail here. In the plasma etching apparatus, there is a processing chamber in which the pressure is reduced to a predetermined degree of vacuum, and gas is fed into the processing chamber. The gas is changed into plasma by an electric field created inside the processing chamber. The plasma includes ions and/or radicals with a high reactivity, and they react physically and chemically with the wafer surface, which is a processing target, to cause the etching to progress.

In typical plasma etching apparatuses, aside from a high frequency voltage for plasma generation, a high frequency voltage is applied to a waferstage in order to control the reaction between the ions and the wafer surface. Upon application of a high frequency voltage to the stage, the time average of the wafer voltage becomes negative. This is referred to as self-biasing, which is caused by two factors. One of the factors is that a capacitor existing between the high frequency power supply and the stage blocks DC current, and the other is that a sheath occurring between the plasma and the stage has the rectification function. Since the self-biasing accelerates positive ions in the plasma, the etching is promoted. In addition, because the trajectory of the positive ions becomes perpendicular to the wafer, anisotropic etching, which forms a trench structure in the material, may be achieved.

In the anisotropic etching, a side wall of the trench is ideally perpendicular to the wafer surface. However, as an aspect ratio of a trench become higher with shrinkage of semiconductor devices, the electron shading effect, which deteriorates the perpendicularity of the side wall, became produced. Specifically, the positive ions enter perpendicularly into the trench, whereas electrons enter isotropically into the trench. Therefore, the side wall of the trench becomes negatively charged, and the bottom becomes positively charged. As a result, the positive ions enter the side wall, so that the side wall is etched.

Technologies for reducing damage caused by the electron shading effect include a technology for removing charged particles from the wafer surface by superimposing a low frequency linear triangular wave voltage or curved triangular wave voltage on the high frequency voltage for self-bias during the plasma processing, as disclosed in PTL 1.

CITATION LIST

Patent Literature

PTL 1: International Publication No. 2020/100357

SUMMARY OF INVENTION

Technical Problem

In conditions where the wafer surface is covered with a dielectric pattern such as a resist pattern or the like, the charge accumulated on the wafer surface are hard to move on the surface of the dielectrics. In contrast to this, PTL 1 discloses a configuration that achieves effective removal of charge by applying a triangular wave voltage to the stage on which a wafer is loaded during the existence of plasma. In such configuration, for increasing the mobility of the charge accumulated on the wafer surface in order to dissipate electrostatic charge on the wafer surface, it is necessary to increase the amplitude of the triangular wave voltage to be applied to the stage to create a greater electric field within the wafer.

On the other hand, increasing the amplitude of the triangular wave voltage causes an increase of the charge accumulated on the capacitor between the high frequency power supply and the stage. While the charged particles exist in the trench formed in the wafer surface, those particles are the increment of charge accumulated on the capacitor. However, after the charged particles are completely removed, charge is taken from another atom in the wafer and accumulated on the capacitor. As a result, the wafer is charged, which adversely affects etching.

The present invention has been made in view of such problems in conventional art, and it is an object of the present invention to provide a plasma processing apparatus and a plasma processing method, in which while the amount of charge removed from a wafer surface is maintained, efficient removal is achieved for precise plasma processing.

Solution to Problem

In order to solve the above problems, an aspect of the present invention provides a plasma processing apparatus that includes: a processing chamber in which a sample undergoes plasma processing; a first high frequency power supply that supplies high frequency power for plasma generation; a sample stage on which the sample is loaded; a second high frequency power supply that supplies high frequency power to the sample stage; a power supply that applies voltage to the sample stage; and a control unit that controls the power supply. In the plasma processing apparatus, a cycle of a waveform of the voltage has a positive ramp period during which the voltage rises, a negative ramp period during which the voltage falls, and a removal amount control period during which an amount of charged particles removed from the sample per unit time is controlled.

In order to solve the above problems, another aspect of the present invention provides a plasma processing method for performing plasma processing on a sample. The plasma processing method includes a step of performing plasma processing on the sample while voltage and high frequency voltage are applied to a sample stage on which the sample is loaded, wherein a cycle of a waveform of the voltage has a positive ramp period during which the voltage rises, a negative ramp period during which the voltage falls, and a removal amount control period during which the amount of charged particles removed from the sample per unit time is controlled.

Advantageous Effects of Invention

According to the present invention, while the amount of charge removed from the wafer surface is maintained, efficient removal is achieved. As a result, the plasma processing apparatus and the plasma processing method are provided which are capable of performing plasma processing with high precision.

DESCRIPTION OF EMBODIMENTS

Figure 1:
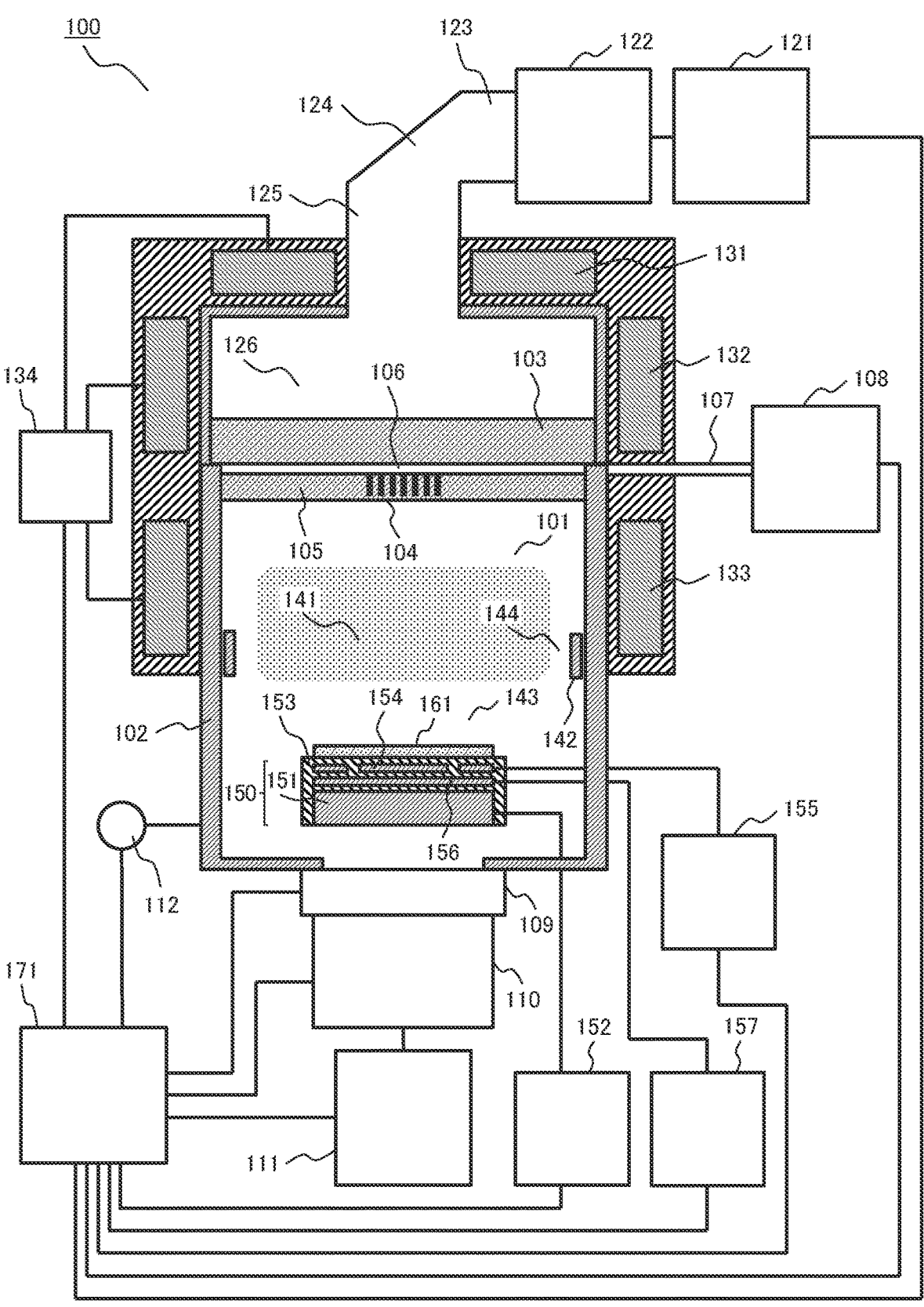
FIG. 1 is a block diagram schematically illustrating the configuration of a plasma processing apparatus in examples according to the present invention.

In order to achieve further reduction in damage by achieving higher anisotropy in etching using a plasma processing apparatus, the time during which the influence of charged particles affects during etching should be minimized. For this purpose, the moving speed of charged particles on the wafer surface is required to be increased for quick removal from the surface. On the other hand, the amount of charge particles removed per unit time is required to be maintained at an optimum value.

In the present invention, for the purpose of increasing the moving speed of charged particles while the amount of charged particles removed from the wafer surface per unit time is maintained at an optimum value, based on a signal from a control mechanism, a DC power supply connected to a stage of the plasma processing apparatus is repeatedly switched to a first phase and a second phase in an alternating sequence. In the first phase, only rise or only drop in output voltage is caused or a single rise and a single drop are caused. In the second phase, the voltage is kept constant.

In this connection, the output voltage at the start of the first phase is the output voltage at the end of the second phase, and the output voltage at the start of the second phase is the output voltage at the end of the first phase. A period of the second phase is (a−1) times as long as the period of the preceding first phase when an amplitude is a times as much as an optimum amplitude in the conventional art. The first phase is configured such that a rise in output voltage persists for 1 ms or more and a drop in output voltage persists for 1 ms or more, in order that the amount of charged particles removed per unit time may be maintained at an optimum value.

For implementing the above-described plasma processing, in the present invention, a plasma processing apparatus includes: a processing chamber in which a sample undergoes plasma processing; a first high frequency power supply that supplies high frequency power for plasma generation; a sample stage on which the sample is loaded; a second high frequency power supply that supplies high frequency power to the sample stage; and a DC power supply that changes and applies voltage depending on a periodically repeating waveform to the sample stage. In the plasma processing apparatus, a periodically repeating voltage waveform to be applied to the sample stage contains a region in which voltage varies over time, and a region in which voltage is constant irrespective of time. By virtue of this, while the amount of charge removed from the wafer surface is maintained, the removal of charge is efficiently performed.

Specifically, in the present invention, plasma processing is performed in a plasma processing apparatus that generates plasma to perform a process on a sample loaded on a sample stage. For this purpose, the plasma processing apparatus is configured such that, during the existence of plasma, while voltage output with a voltage waveform having a period during which output voltage changes and a period during which output voltage is unchanged is superimposed on high frequency voltage, the voltage is applied to the sample stage on which the sample is loaded for plasma processing.

Embodiments according to the present invention will now be described in detail with reference to the accompanying drawings. Throughout the figures used to describe the embodiments, like reference signs are used to indicate components/elements having like functions, and a repeated description is omitted in principle.

However, the present invention should not be construed as being limited to details of the following embodiments. Those of ordinary skill in the art will readily understand that the specific configurations described herein can be changed without departing from the scope and sprit of the present invention.

EXAMPLES

Example embodiments of a plasma processing apparatus according to the present invention will be described below with reference to FIG. 1 to FIG. 8. FIG. 1 illustrates schematically an example configuration of a plasma processing apparatus in the examples.

The plasma processing apparatus 100 in the example shown in FIG. 1 is a microwave ECR plasma etching apparatus as one such example. FIG. 1 illustrates a vacuum processing chamber 101 installed in the plasma processing apparatus 100, in which an electrode placed in the interior of the vacuum processing chamber 101, an electric and magnetic field generator installed outside, and the like are schematically illustrated.

The vacuum processing chamber 101 has a structure such that a container 102 electrically insulated from the surroundings has a top hermetically sealed by a dielectric window 103. A dielectric shower plate 105 with a plurality of fine pores 104 is placed directly below the dielectric window 103. A gas feeding mechanism 108 is connected via gas piping 107 to a space 106 between the dielectric window 103 and the shower plate 105. The space 106 and the vacuum processing chamber 101 communicate with each other through the fine pores 104.

A lower portion of the vacuum processing chamber 101 is connected to a turbomolecular pump 110 via a variable conductance valve 109. In turn, the turbomolecular pump 110 is connected to a roughing pump 111. The gas within the vacuum processing chamber 101 is exhausted by the turbomolecular pump 110. Both the turbomolecular pump 110 and the vacuum processing chamber 101 are formed approximately in a cylindrical shape, and both of them have the same axis. Because of this, the flow of gas exhausted is axisymmetric, so that the plasma processing is performed uniformly with respect to the axis. The pressure inside the vacuum processing chamber 101 is controlled to maintain a desired value by adjusting the opening degree of the variable conductance valve 109. For this control, a feedback control is used which is based on a value of a pressure gauge 112 connected to the vacuum processing chamber 101.

A microwave power supply 121 is installed above the vacuum processing chamber 101, and is connected to a cavity resonator 126 via a microwave propagation path, which is equipped with an automatic matching device 122, a rectangular waveguide 123, a rectangular-to-circular waveguide converter 124, and a circular waveguide 125 in this order. The cavity resonator 126 is installed on an upper portion of the dielectric window 103. It is noted that the automatic matching device 122 plays a role in automatically adjusting impedance to suppress the reflected wave. The microwave output from the microwave power supply 121 propagates to the cavity resonator 126 through the above path. The cavity resonator 126 adjusts the microwave distribution to be suitable for the plasma processing. The microwave whose distribution is adjusted further propagates to the vacuum processing chamber 101 via the dielectric window 103 and the shower plate 105. It is noted that a typical frequency of microwave is 2.45 GHZ.

All solenoid coils 131, 132, 133 are installed in a ring form around the vacuum processing chamber 101 and the cavity resonator 126. A coil power supply 134 supplies a current to the solenoid coils 131, 132, 133 to form a magnetic field inside the vacuum processing chamber 101.

In a region that satisfies a specific relationship between frequency of the electric field and intensity of the magnetic field within the vacuum processing chamber 101, ECR (Electron Cyclotron Resonance) occurs. This region is referred to as an ECR region, in which, for example, when the electric field is 2.45 GHz, the intensity of the magnetic field is 0.0875 T. Electrons in the ECR region efficiently receive energy from the electric field to promote dissociation and ionization of the ambient gas. As a result, plasma 141 is generated in the ECR region and diffuses inside the vacuum processing chamber 101.

The position of the ECR region is controllable by the magnetic field distribution in the interior of the vacuum processing chamber 101. Also, because the charged particles in the plasma move along the magnetic lines of force, the diffusion of charged particles is controllable by the magnetic field distribution in the interior of the vacuum processing chamber 101. On the other hand, the control on the magnetic field distribution in the interior of the vacuum processing chamber 101 may be implemented by controlling a current flowing through each of the solenoid coils 131, 132, 133. Therefore, the plasma processing apparatus 100 is configured to be capable of improving the uniformity of the plasma processing.

A sample stage 150 installed with an electrode 151 therein is placed and secured in the interior of the vacuum processing chamber 101 by a joist which is not shown. The sample stage 150 and the vacuum processing chamber 101 are formed approximately in a cylindrical shape, and both have the same central axis. Therefore, the plasma processing is performed uniformly with respect to the axis. A wafer (sample) 161 which is a processing target is transferred onto the upper surface of the sample stage 150 by a transfer apparatus such as a robot arm or the like (not shown) included in the plasma processing apparatus 100.

A top face and side faces of the electrode 151 are covered with a dielectric film 153. An electrostatic chuck electrode 154 is installed in the interior of the dielectric film 153 near the top face of them, and the electrostatic chuck electrode 154 is divided into parts on the center side and the outer periphery side of the sample stage 150. Further, the electrostatic chuck electrode 154 is connected to an electrostatic chuck power supply 155. Upon application of different voltages to the center side and the outer peripheral side of the electrostatic chuck electrode 154, attractive forces occur between the wafer 161 and the electrostatic chuck electrodes 154. As a result, the wafer 161 is held on the electrode 151.

The plasma 141 is produced mainly above the electrode 151. A sheath 143 and a sheath 144 are formed respectively between the plasma 141 and the wafer 161 and between the plasma 141 and an earth 142. Radicals and ions with a high reactivity exist in the plasma 141, which pass through the sheath 143 to reach the wafer 161. On the wafer 161, the radicals and ions interact with the wafer materials, so that the materials of the surface of the wafer 161 is etched.

The electrode 151 is connected to a bias voltage generator 152. Upon application of a high frequency voltage to the electrode 151 from the bias voltage generator 152, an electric circuit is formed through dielectric film 153, the wafer 161, the sheath 143, then the plasma 141 to the earth 142. As a result, a high frequency voltage is also generated in the wafer 161. Simultaneously, a DC self-bias voltage is also developed in the wafer 161. The high frequency voltage and the self-bias voltage in the wafer 161 accelerate positive ions in the plasma 141 toward the wafer 161 within the sheath 143. Therefore, the bias voltage generator 152 may be controlled to control the etching function.

A temperature control film 156 is formed above the electrode 151, and is connected to a temperature control mechanism 157. The mechanism controls the temperature of the wafer 161, enabling the control on the plasma processing geometry.

In the above configuration, all components are connected to a control computer in a control unit 171, so that the timing and the operating quantity thereof are controlled to achieve operation in an appropriate sequence. Detailed parameters of the operation sequence are called recipes and the control is performed based on the preset recipes. Typically, a recipe consists of a plurality of processes, and each process is executed in the preset sequence and time. In each process, process conditions are set such as a type and a flow rate of gas fed from the gas feeding mechanism 108 to the vacuum processing chamber 101, an output power of the microwave power supply 121, the amount of current passing through the solenoid coils 131, 132, 133, condition of a bias voltage generated by the bias voltage generator 152, and the like.

Figure 2:
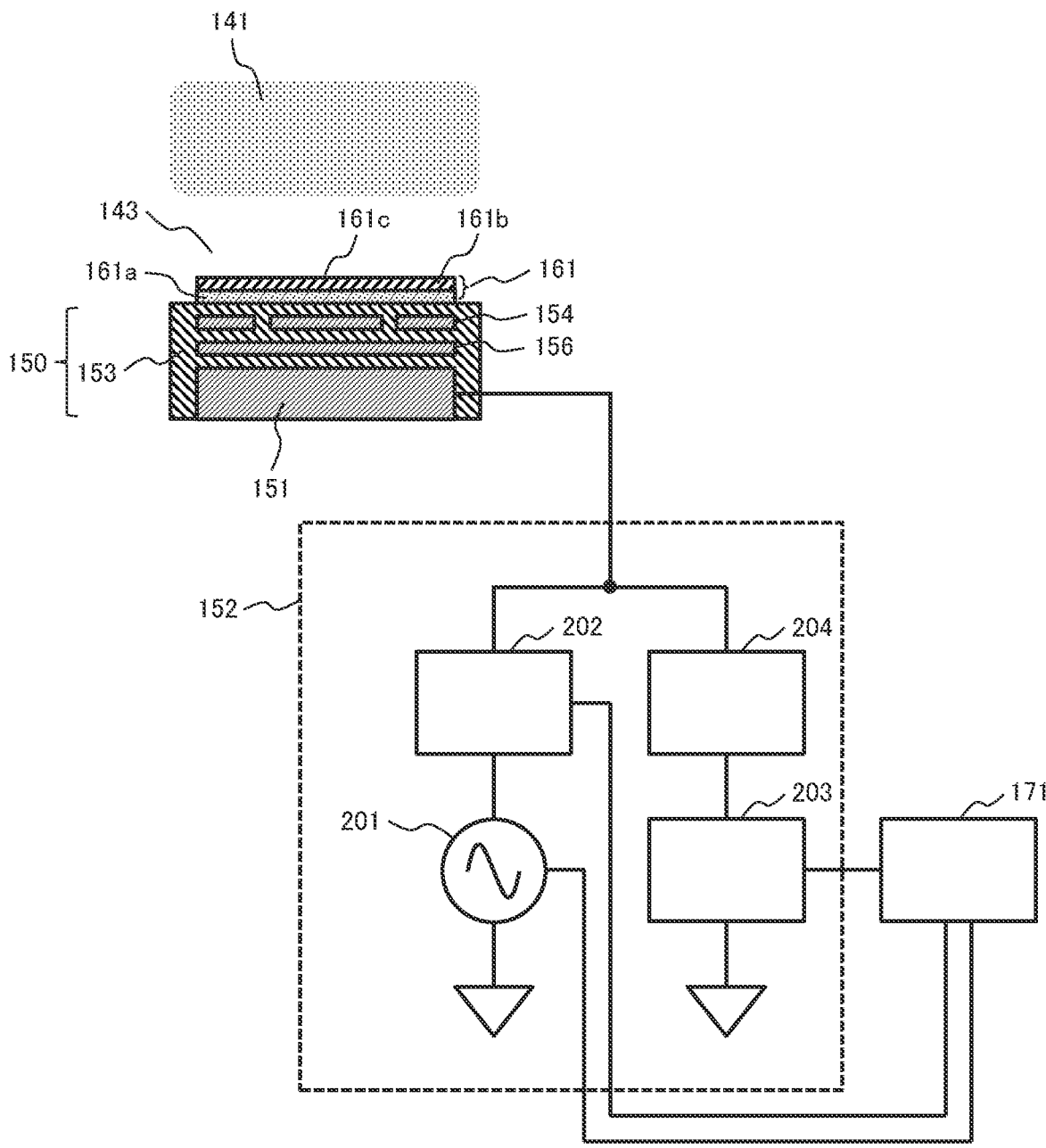
FIG. 2 is a cross sectional view of an electrode 151 and a detailed block diagram illustrating a bias voltage generator 152 in examples according to the present invention.

FIG. 2 is a schematic diagram illustrating details of the sample stage 150, the bias voltage generator 152 and the wafer 161 in the example shown in FIG. 1.

The wafer 161 loaded on the sample stage 150 is configured to include a dielectric film 161b formed on a silicon base material 161a. A surface 161c of the wafer 161 is exposed to the ions and radicals in the plasma 141 passing through the sheath 143.

The bias voltage generator 152 includes a high frequency power supply 201, an automatic matching device 202, a DC power supply 203, and a lowpass filter 204. The high frequency power supply 201 is connected via the automatic matching device 202 to the electrode 151, and the DC power supply 203 is connected via the lowpass filter 204 to the electrode 151. All the high frequency power supply 201, the automatic matching device 202, and the DC power supply 203 are connected to the control unit 171 so that the operation thereof is controlled according to instructions from the control unit 171.

An output frequency of the high frequency power supply 201 is lower than the output frequency of the microwave power supply 121, and also is high enough to transfer the voltage to the wafer 161 via the dielectric film 153. Specifically, the output frequency of the high frequency power supply 201 ranges from hundreds kHz to several MHz. The automatic matching device 202 matches impedance by varying the circuit constant of an internal element depending on the impedance of the plasma 141 such that the power of the high frequency power supply 201 is efficiently transferred to the sheath 143.

Figure 3:
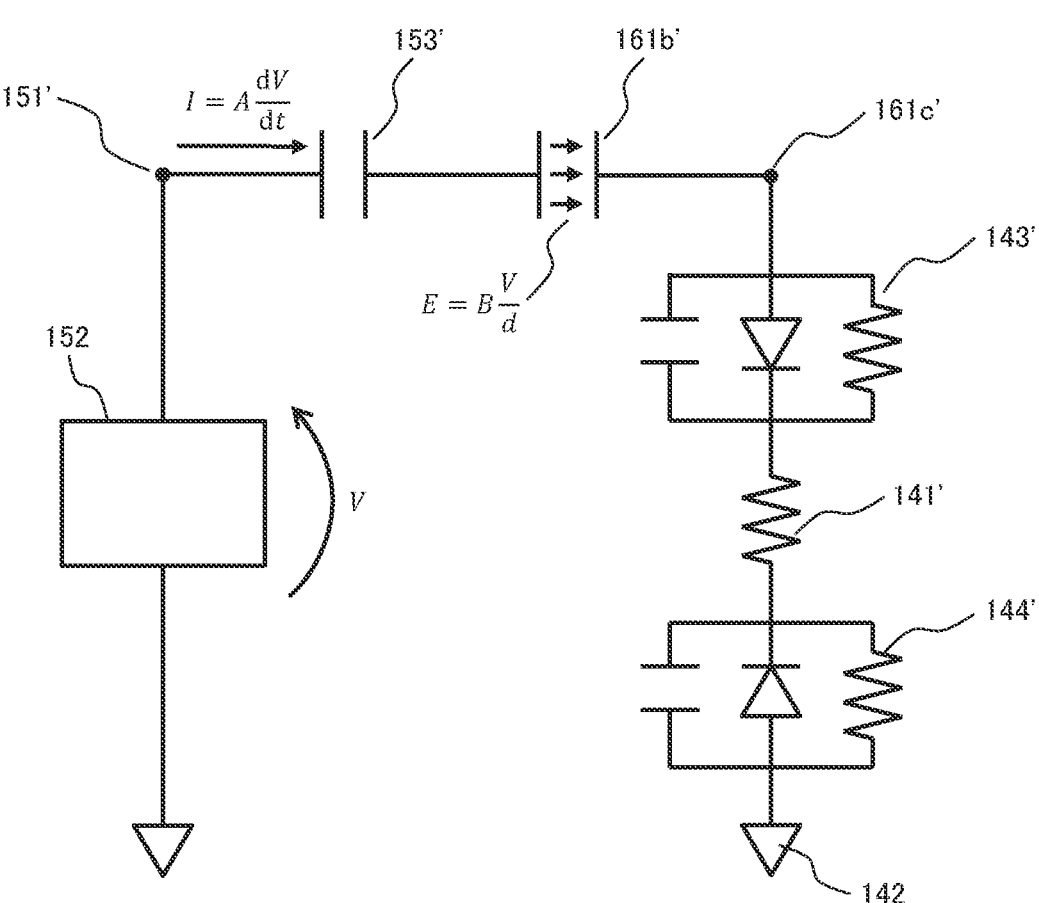
FIG. 3 is a circuit block diagram illustrating an electrically equivalent circuit of the plasma processing apparatus 100 in the examples illustrated in FIG. 1.

FIG. 3 illustrates an electrically equivalent circuit of the plasma processing apparatus 100 in the example shown in FIG. 1. The output from the bias voltage generator 152 travels through a point 151' corresponding to the electrode 151, capacitance 153' corresponding to the dielectric film 153, capacitance 161b' representing the dielectric film 161b on the wafer 161, a point 161c' corresponding to the surface 161c of the wafer 161, a parallel circuit 143' corresponding to the sheath 143, resistance 141' corresponding to the plasma 141, and then a parallel circuit 144' corresponding to the sheath 144 in this order, to reach the earth 142.

In the equivalent circuit, the relationship I=A×dV/dt is approximately established using a proportionality constant A between a voltage V generated at the bias voltage generator 152 and a current I flowing from the bias voltage generator 152 through the wafer 161 to the earth 142. Specifically, the current I flowing from the bias voltage generator 152 to the wafer 161 is proportional to a derivative value of the voltage V generated at the bias voltage generator 152.

Also, assuming that the thickness of the dielectric film 161b is d, an electric field E generated within the dielectric film 161b on the wafer 161 is expressed approximately by E=BV/d using a proportionality constant B. Specifically, the electric field E generated within the dielectric film 161b on the wafer 161 is proportional to the voltage V generated at the bias voltage generator 152, but is inversely proportional to the thickness d of the dielectric film 161b.

Figure 4:
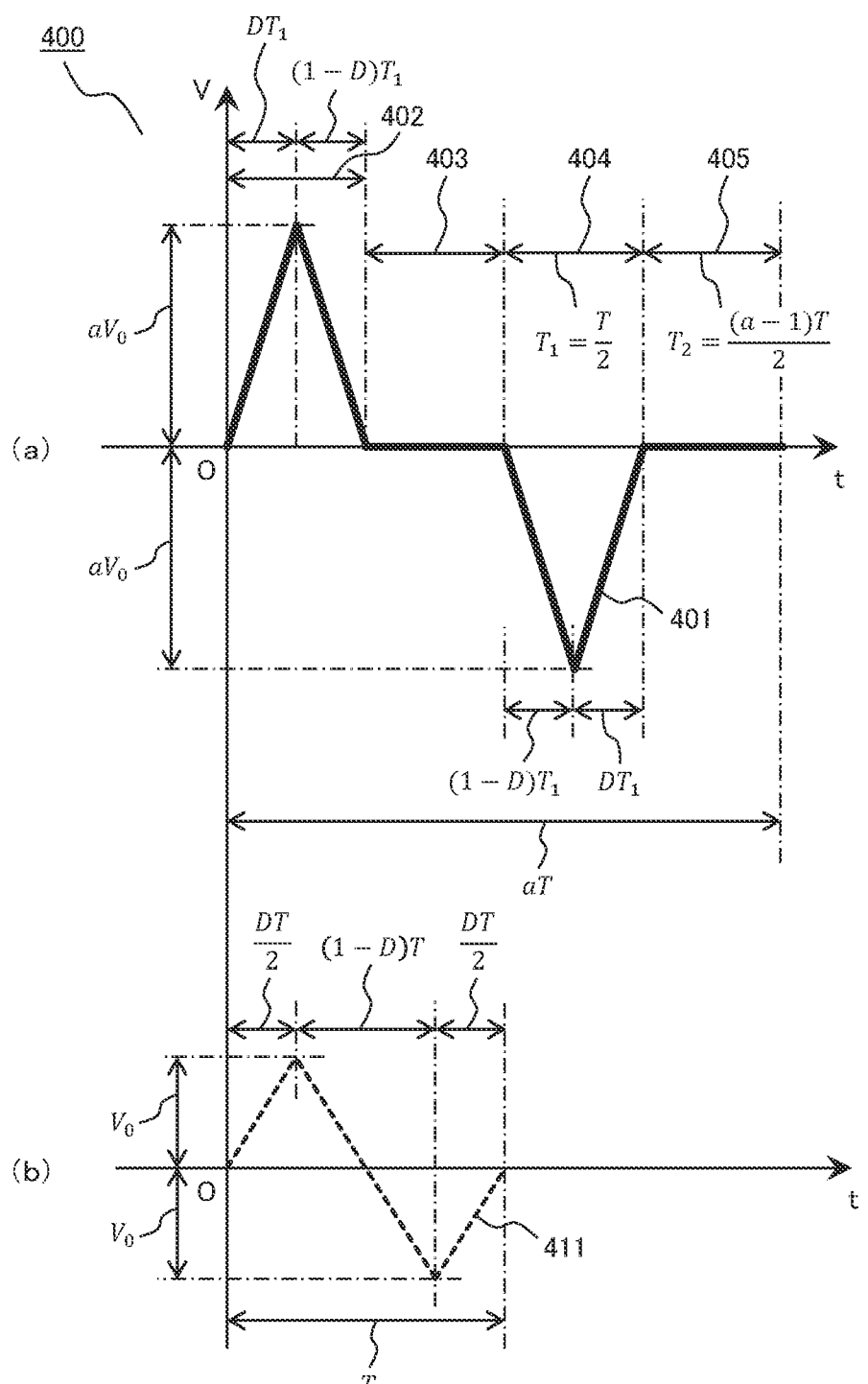
FIG. 4 is a voltage waveform diagram illustrating a voltage waveform output by a direct current power supply 203 of the plasma processing apparatus 100 according to the examples.

(a) of FIG. 4 illustrates a voltage waveform output by the DC power supply 203 in the example shown in FIG. 1. The DC power supply 203 outputs an intermittent triangular wave voltage 401 illustrated in a graph 400 in accordance with instructions from the control unit 171. A cycle of the intermittent triangular wave voltage 401 in (a) consists of time domains 402 and 404 in which the voltage changes, and time domains 403 and 405 in which the voltage is constant. The time domains 402, 403, 404, 405 appear in this order.

A triangular wave voltage 411 in (b) of FIG. 4 is illustrated for the purpose of comparison with the intermittent triangular wave voltage 401 in (a). In the non-intermittent triangular wave voltage 411, both a positive ramp and a negative ramp of the voltage waveform are a straight line with a constant slope. This allows a constant current to flow for a predetermined length of time. Appropriately setting the constant current value and the predetermined length of time enables efficient removal of charge accumulated on the surface 161c of the wafer 161 exposed to the plasma 141. The triangular wave voltage 411 in (b) of FIG. 4 is shown in a waveform most suitable for removal of charged particles from the wafer 161.

Assuming here that the amplitude of the triangular voltage 411 in FIG. 4(b) is $V_0$, the cycle is T, and the ratio of the time during which voltage decreases to one cycle is (1-D). D is a constant that exceeds zero and is below one, and the optimum value is determined from the mobility of positive ions and electrons within the dielectric film 161b on the wafer 161. Specifically, if the mobility of electrons within the dielectric film 161b on the wafer 161 is $\mu_e$, and the mobility of positive ions is $\mu_i$, $D=\mu_i/(\mu_e+\mu_i)$ is given.

Stated another way, D is a value obtained by dividing the mobility of ions by the sum of the mobility of electrons within a dielectric film and the mobility of ions within the dielectric film on a wafer. At this time, the ratio of the time that the voltage drops to the time that the voltage rises on the triangular wave voltage 411 in (b) of FIG. 4 is $(1/\mu e):(1/\mu i)$, which means the ratio of the time required for the movement of negative charges to the time required for the movement of positive charges.

The amplitude of the intermittent triangular wave voltage 401 in FIG. 4(a) is expressed by $aV_0$ using a constant a equal to or greater than one. Also, the length $T_1$ of the time domain 402, 404 is expressed by T/2, and the length $T_2$ of the time domain 403, 405 is expressed by (a-1) T/2. That is, a cycle of the intermittent triangular wave voltage 401 is aT. Further, in the time domain 402, the voltage of the intermittent triangular wave voltage 701 rises from zero at first to $aV_0$ over time $DT_1$, then drops from $aV_0$ to zero over time $(1-D)$ $T_1$. A time ratio of the period during a voltage rise to the period during a voltage drop is expressed by D:(1-D). On the other hand, in the time domain 404, the voltage drops from zero at first to $-aV_0$ over time $(1-D)$ $T_1$, then rises from $-aV_0$ to zero over time $DT_1$. A time ratio of the period during a voltage drop to the period during a voltage rise is expressed by (1-D):D.

It is noted that, for the purpose of moving and removing the charge accumulated inside the dielectric film 161b of the wafer 161 to the outside of the dielectric film 161b, 1 ms or longer is desirably ensured as a length of time during which the current I continuously passes, with consideration given to the mobility of charge (electrons and positive ions) in the dielectric film $161b$. In short, in the waveform diagram in FIG. $4(a)$, both $DT_1$ and $(1-D) T_1$ must be not less than 1 ms. Stated another way, when $T_1$ is expressed in milliseconds, $T_1 \geq 2/D$ and $T_1 \geq 2/(1-D)$. This is because the charged particles of the surface $161c$ of the dielectric film $161b$ move slowly as described above, which therefore cannot be removed unless an electric field in the same direction is generated throughout the duration of 1 ms or longer.

Figure 5:
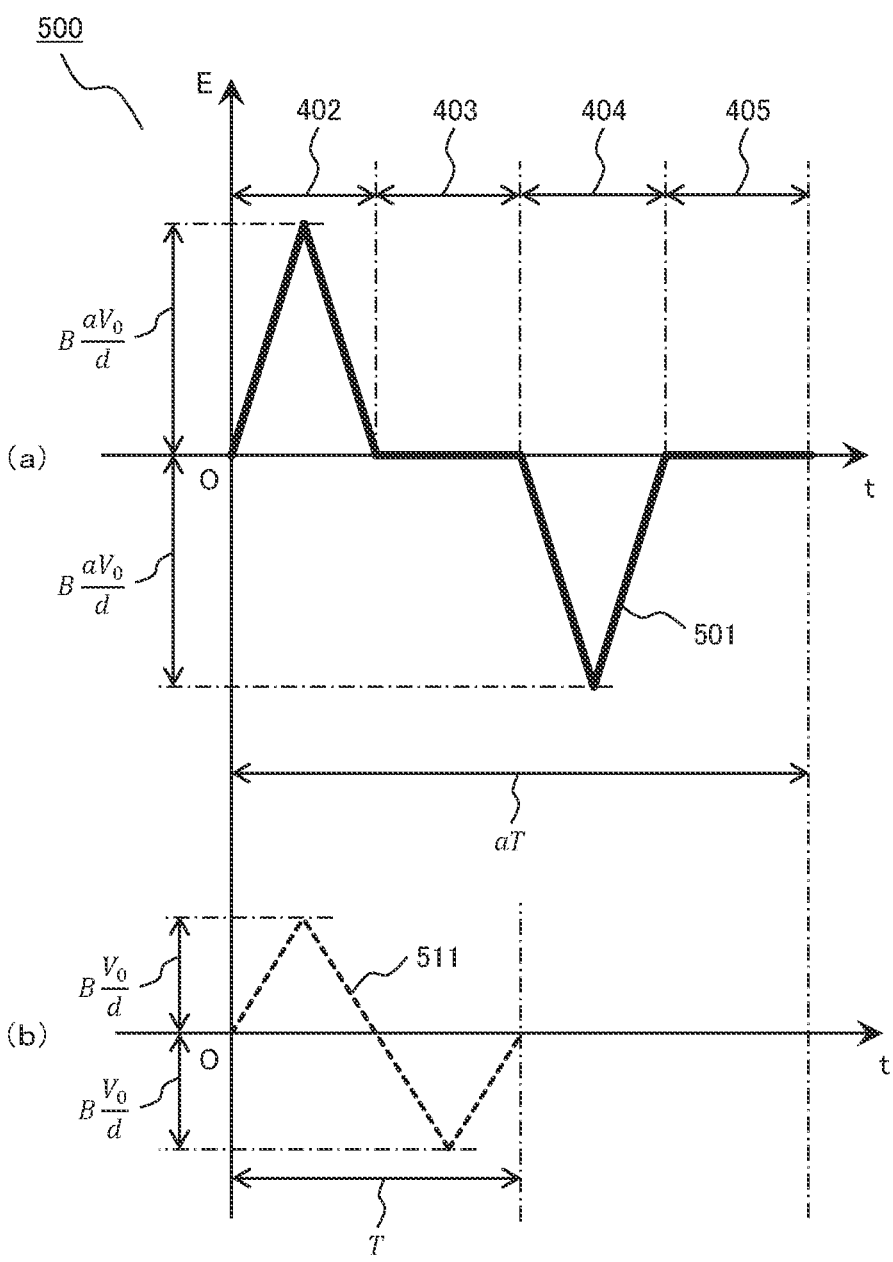
FIG. 5 is a waveform diagram illustrating the intensity of an electric field generated within a dielectric film 161$b$ on a wafer 161 in the plasma processing apparatus 100 according to the examples.

FIG. 5 is a waveform chart 500 showing the intensity of an electric field generated within the dielectric film $161b$ on the wafer 161 in the example illustrated in FIG. 1, in which a waveform 501 in (a) represents the case of using the intermittent triangular wave voltage 401 shown in (a) of FIG. 4, and a waveform 511 in (b) represents the case of using the triangular wave voltage 411 shown in (b) of FIG. 4.

When using the intermittent triangular wave voltage 401 in FIG. $4(a)$, the electric field intensity becomes a maximum of $B \times aV_0/d$ as illustrated in FIG. $5(a)$. On the other hand, when using the triangular wave voltage 411 in FIG. $4(b)$, the electric field intensity becomes a maximum of $B \times V_0/d$ as illustrated in FIG. $5(b)$.

It is understood from this that, as compared with when the triangular wave voltage 411 as illustrated in FIG. $4(b)$ is output from the DC power supply 203, an electric field with an a-fold intensity is generated in the dielectric film $161b$ on the wafer 161 when the intermittent triangular wave voltage 401 as illustrated in FIG. $4(a)$ is output from the DC power supply 203. As the electric field produced in the dielectric film $161b$ is stronger, a greater force acts on the charge accumulated on the surface $161c$ of the wafer 161. Thus, the charge on the surface $161c$ may be efficiently removed.

Figure 6:
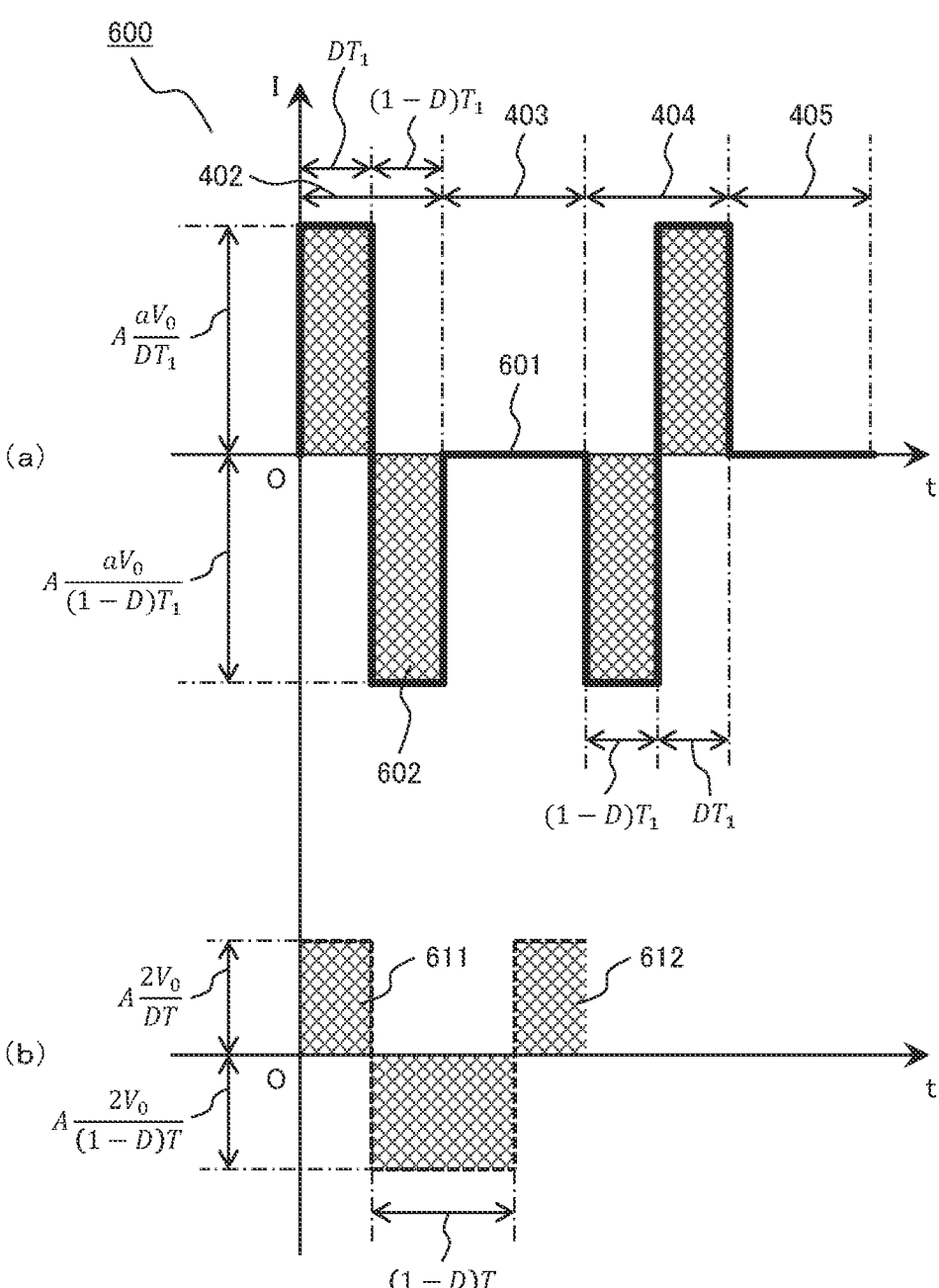
FIG. 6 is a current waveform diagram illustrating an electrical current flowing through the wafer 161 in the plasma processing apparatus 100 according to the examples

FIG. 6 is a graph 600 showing the waveform of a current passing though the wafer 161 in the example illustrated in FIG. 1, in which a waveform 601 in (a) represents the case of using the intermittent triangular wave voltage 401 shown in (a) of FIG. 4, and a waveform 611 in (b) represents the case of using the triangular wave voltage 411 shown in (b) of FIG. 4.

When using the intermittent triangular wave voltage 401 in FIG. $4(a)$, the current flowing in the time period during which the output voltage of the DC power supply 203 rises is expressed by $A \times aV_0/(DT_1)$ as illustrated in FIG. $6(a)$, and the current flowing in the time period during which it drops is expressed by $A \times aV_0/((1-D) T_1)$. On the other hand, when using the triangular wave voltage 411 in FIG. $4(b)$, a current $A \times 2V_0/(DT_1)$ as illustrated in FIG. $6(b)$ flows in the time period during which the output voltage of the DC power supply 203 rises, and a current $A \times 2V_0/((1-D) T_1)$ flows in the time period during which it drops.

The total area of double hatched portions 602 in FIG. $6(a)$ represents the amount of charge flowing from the wafer surface $161c$ when the intermittent triangular wave voltage 401 in FIG. $4(a)$ is used. When the triangular wave voltage 411 in FIG. $4(b)$ is used, the total area of double hatched portions 612 in FIG. $6(b)$ corresponds to the amount of charge in question. Therefore, the amount of charge moving per unit time when the intermittent triangular wave voltage 401 in FIG. $4(a)$ is used has a value obtained by dividing the total area of the double hatched portions 602 by the time period of one cycle, i.e., $4AV_0/T$. On the other hand, when the triangular wave voltage 411 in FIG. $4(b)$ is used, the amount of charge in question also has $4AV_0/T$. That is, the amount of charge moving per unit time is the same when either of the intermittent triangular wave voltage 401 or the triangular wave voltage 411 is used.

According to the above description, using the intermittent triangular wave voltage 401 in FIG. $4(a)$ makes it possible to maintain the same amount of charge removed from the wafer surface $161c$ as that when the triangular wave voltage 411 in FIG. $4(b)$ is used, while performing the removal in question in a shorter time with higher efficiency as compared with the use of the triangular wave voltage 411.

By virtue of this, using the intermittent triangular wave voltage 401 in FIG. $4(a)$ enables shortening of the time period during the entrance of high energy charged particles from the plasma 141 due to the charge accumulated on the surface $161c$ of the wafer 161, as compared with the use of the triangular wave voltage 411 in FIG. $4(b)$. Thus, damage to the wafer surface $161c$ due to the electron shading effect may be inhibited.

Figure 7:
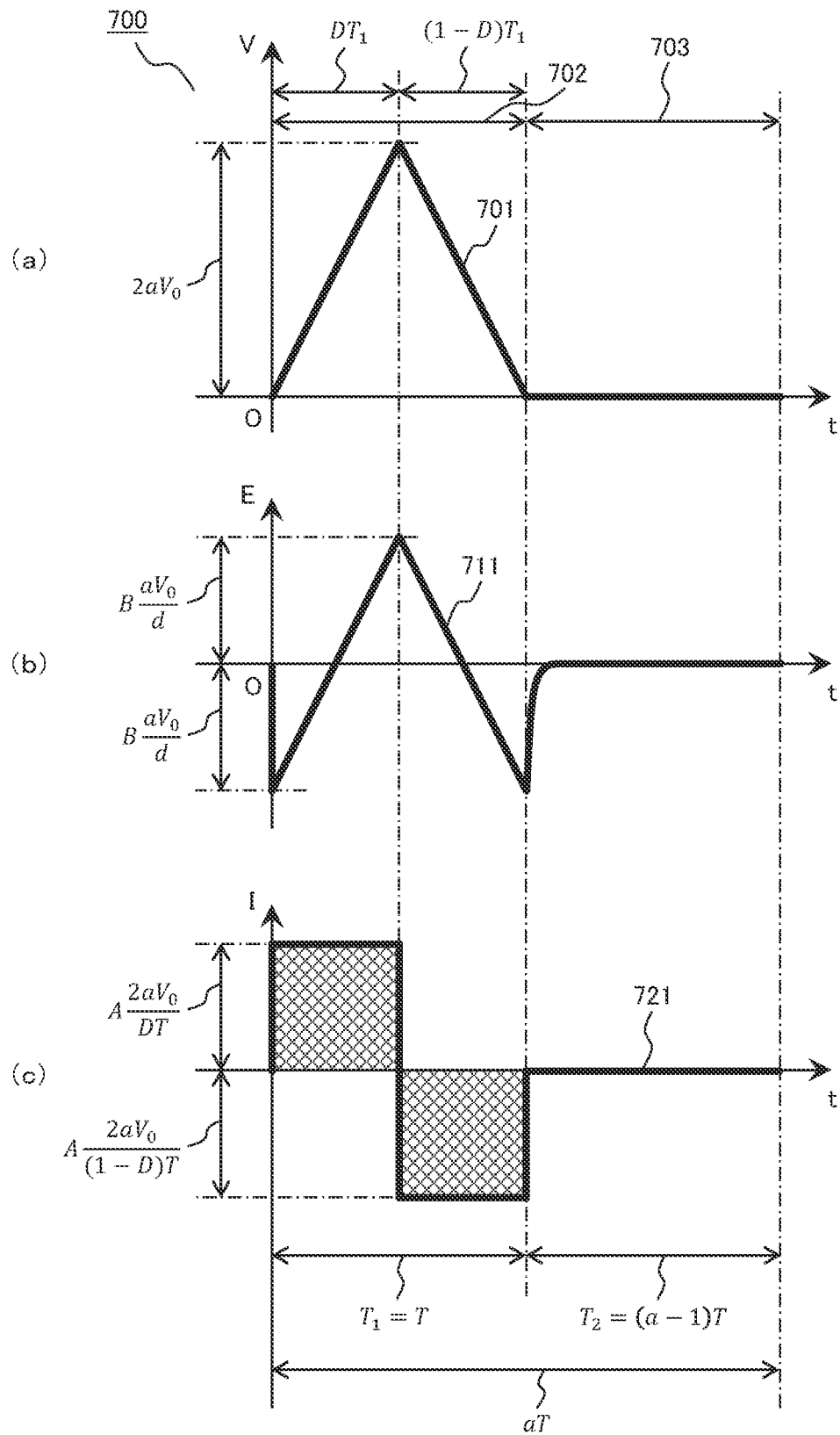
FIG. 7 is a voltage waveform diagram illustrating a modification of voltage waveforms output by the direct current power supply 203 in the plasma processing apparatus 100 in the examples.

Further, even if an intermittent triangular wave voltage 701 with a triangular wave with only one positive peak illustrated in (a) of the graph 700 in FIG. 7 is used instead of the intermittent triangular wave voltage 401 with a combination of a triangular wave with a positive peak and a triangular wave with a negative peak illustrated in (a) of FIG. 4, the same advantageous effects may be achieved. In one cycle of the intermittent triangular wave voltage 701, a time domain 702 in which the voltage changes appears first, and then a time domain 703 in which the voltage is constant appears.

The maximum voltage of the intermittent triangular wave voltage 701 is expressed by $2aV_0$ using a constant a equal to or greater than one. Also, the length $T_1$ of the time domain 702 is expressed by $T/2$, and the length $T_2$ of the time domain 703 is expressed by $(a-1) T$. That is, a cycle of the intermittent triangular wave voltage 701 is $aT$. In the time domain 702, the voltage of the intermittent triangular wave voltage 701 rises from zero at first to $2aV_0$ over time $DT_1$, then drops from $2aV_0$ to zero over time $(1-D) T_1$. The time ratio of the period during a voltage rise to the period during a voltage drop is expressed by $D:(1-D)$.

When using the intermittent triangular wave voltage 701, the maximum intensity of an electric field 711 produced within the dielectric film $161b$ on the wafer 161 becomes $B \times aV_0/d$ as illustrated in FIG. $7(b)$, which is a times as much as the one when using the triangular wave voltage 411 illustrated in FIG. $4(b)$. Also, when using the intermittent triangular wave voltage 701, the amount of charge moving per unit time due to the current 721 passing through the wafer 161 is $4AV_0/T$, as illustrated in FIG. $7(c)$. This is the same as that when using the intermittent triangular wave voltage 401 illustrated in FIG. $4(a)$.

According to the above description, even if the intermittent triangular wave voltage 701 is used, as in the case of using the intermittent triangular wave voltage 401, it is possible to maintain the same amount of charge removed from the triangular wave voltage 411 and the wafer surface $161c$ while performing the removal in question with efficiency.

Figure 8:
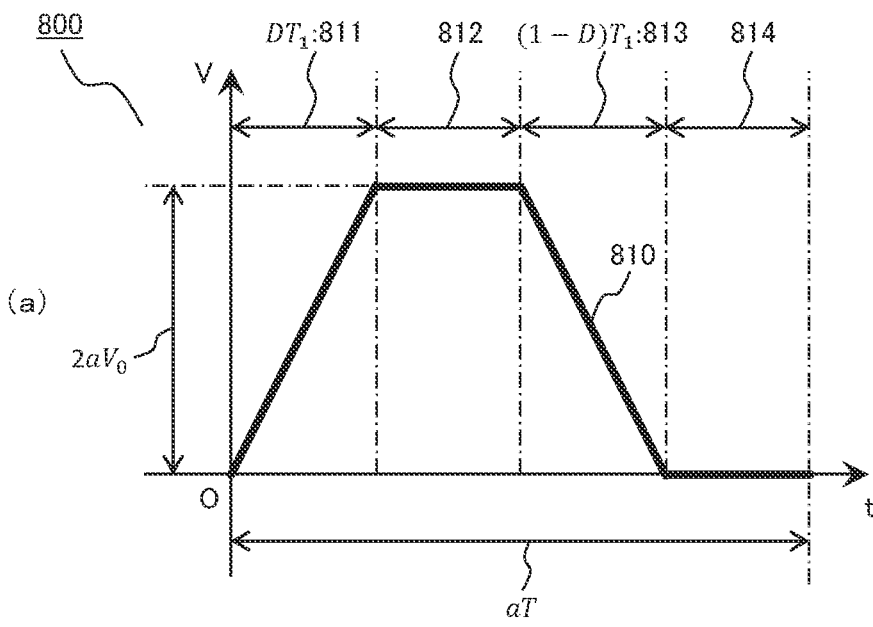
FIG. 8 is a voltage waveform diagram illustrating a modification of a voltage waveform output by the direct current power supply 203 according to the examples.
Figure 8:
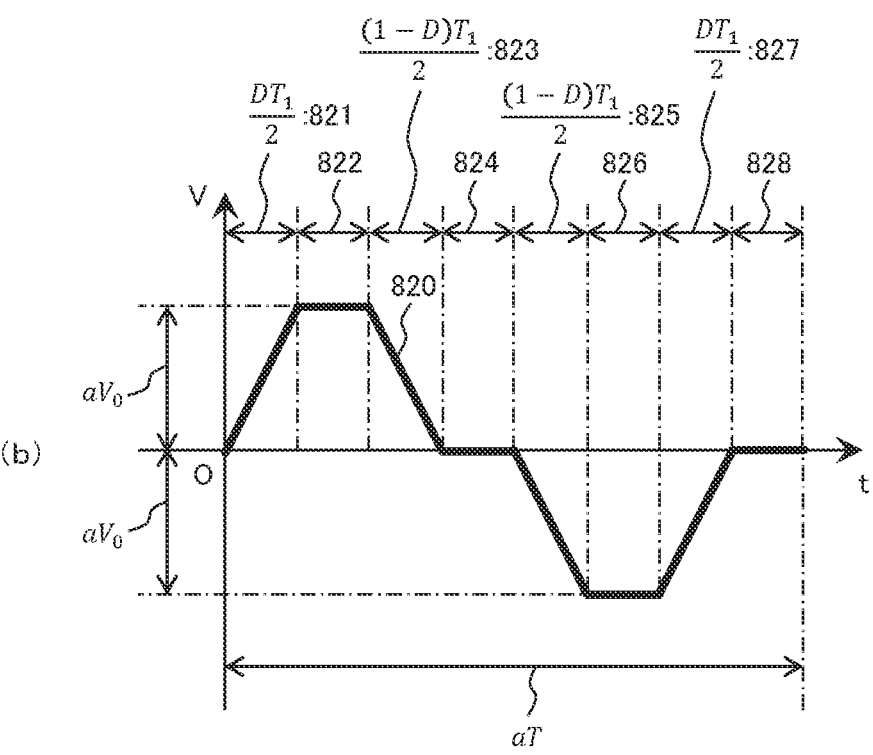

Alternatively or in addition, even if a voltage waveform 801 in the form of a single trapezoidal shaped waveform illustrated in (a) in FIG. 8 or a voltage waveform 802 in the form of a double trapezoidal shaped waveform illustrated in (b) in FIG. 8 is used, the same advantageous effect may also be obtained. In other words, the amplitude of the triangular wave voltage 411 multiplies a-fold and the time domain in which the voltage remains constant from the preceding voltage is added to one place or two places or more in the waveform. At this time, the total length of the time domain in question in one cycle is (a−1) T. Also, a position where the voltage becomes zero volts may be arbitrarily selected. This is because a DC component is blocked by the dielectric film 153.

It is noted that the example shown in FIG. 4 is provided for illustrating the two intermittent triangular wave voltages 401, which is provided for illustration purpose without limitation, and four or more intermittent triangular wave voltages may be applied during the period of time aT. By increasing the number of intermittent triangular wave voltages to be applied, the constant voltage time during which each intermittent triangular wave voltage corresponding to the time domain 403 and 405 illustrated in FIG. 4 is applied may be shortened. Thus, the time that the charged particles entering from the plasma remain on the wafer surface may become shorter in duration.

According to the example, aside from the high frequency bias voltage applied to the stage, a triangular wave voltage with a higher peak value is superimposed intermittently so that sufficient current to remove charge accumulated on the wafer surface is generated for a predetermined length of time, thereby suppressing the electron shading effect caused by the accumulation of charge on the wafer surface. This makes it possible to reduce damage to the wafer surface due to the electron shading effect. Then, after the charged particles accumulated on an insulating film surface of the sample has been removed, the trench shape with high perpendicularity may be formed. In turn, the damage to a film that is not intended to be etched within the trench may be reduced.

According to the example, further, an intermittent triangular wave voltage with high peak voltage is applied while the amount of charged particles removed per unit time from the wafer surface is maintained at an optimum value, so that the plasma processing may be performed on the wafer while the charged particles are more rapidly removed. Therefore, the plasma processing method may be provided which reduces the shape damage caused by the electron shading effect to be less than a conventional one.

Modification 1

Figure 9:
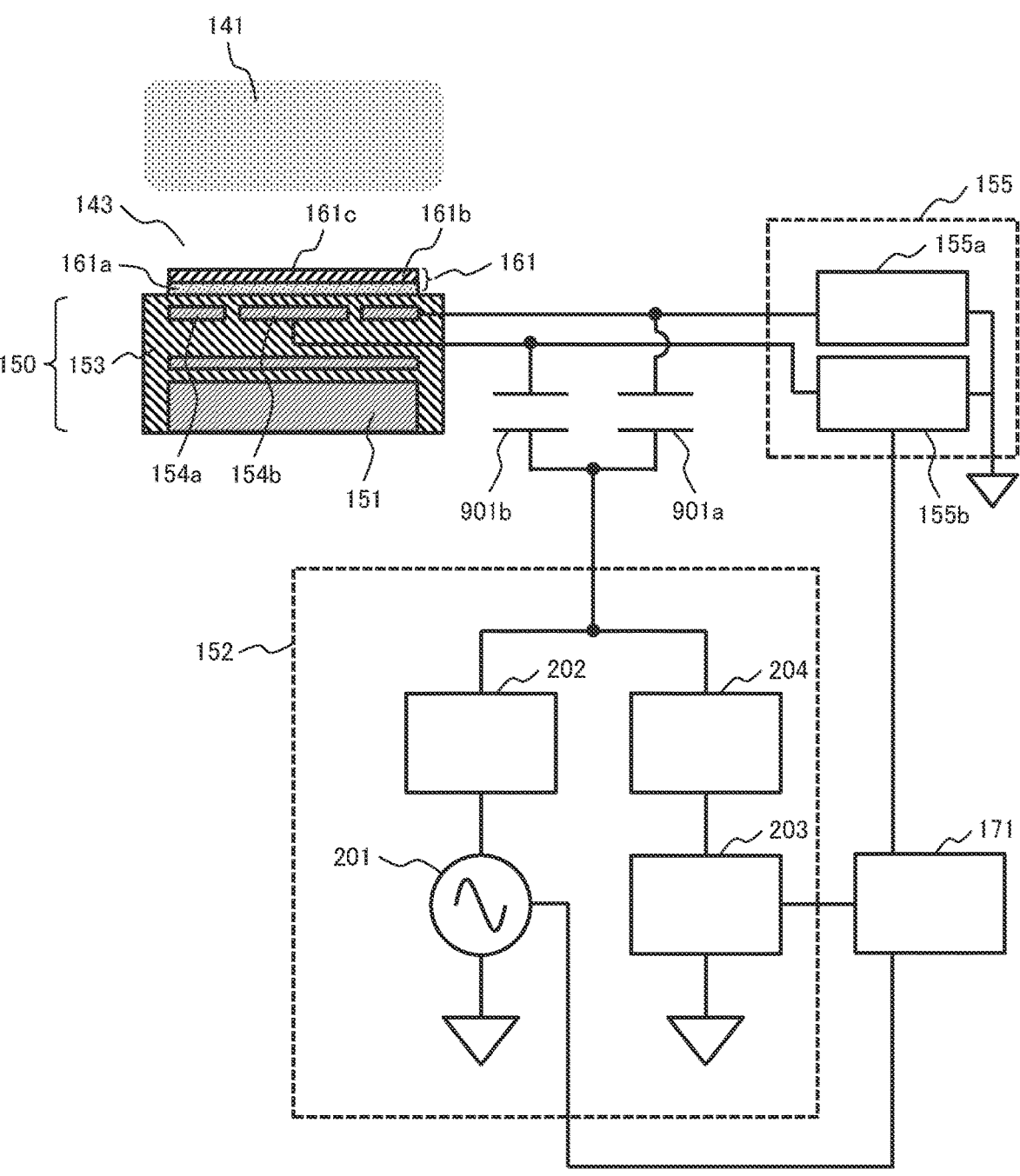
FIG. 9 is a cross sectional view of an electrode 151 and a detailed block diagram illustrating a bias voltage generator 152 and an electrostatic chuck power supply 155 in Modification 1 according to the present invention.

With reference to FIG. 9, a first modification (Modification 1) of examples according to the present invention is described. It is noted that the components indicated by like reference signs used in common between FIG. 9 in Modification 1 and FIGS. 1 and 2 described in the examples have like functions. Therefore, a description of the components is omitted.

FIG. 9 is a cross sectional view of the sample stage 150 and a detailed block diagram illustrating the bias voltage generator 152 and the electrostatic chuck power supply 155 in Modification 1. In the modification, the bias voltage generator 152 is connected in parallel to both electrostatic chuck electrodes 154a and 154b via capacitors 901a and 901b. The electrostatic chuck power supply 155 includes power supply units 155a and 155b that are connected to electrostatic chuck electrodes 154a and 154b, respectively.

The capacitors 901a and 901b play a role in preventing the DC voltage output from the electrostatic chuck power supply 155 from transferring to the bias voltage generator 152. The advantageous effects equivalent to those in the example illustrated in FIG. 1 may also be produced by causing the capacitors 901a and 901b to simulate the electrostatic capacitance between the electrode 151 in the example illustrated in FIG. 1 and the electrostatic chuck electrodes 154a and 154b.

Specifically, the wafer 161 may benefit from the effect of more rapidly removing the charged particles by applying the intermittent triangular wave voltage with a higher peak value of voltage while the amount of charged particles removed from the wafer surface per unit time is maintained at an optimum value. Therefore, the plasma processing apparatus may be provided which is capable of inhibiting the shape damage caused by the electron shading effect to be less than a conventional one.

In the modification, the plasma processing may also be performed on the wafer while more rapidly removing the charged particles with the amount of charged particles removed from the wafer surface per unit time remaining maintained at an optimum value. Therefore, the plasma processing method may be provided which reduces the shape damage caused by the electron shading effect to be less than a conventional one.

Modification 2

Figure 10:
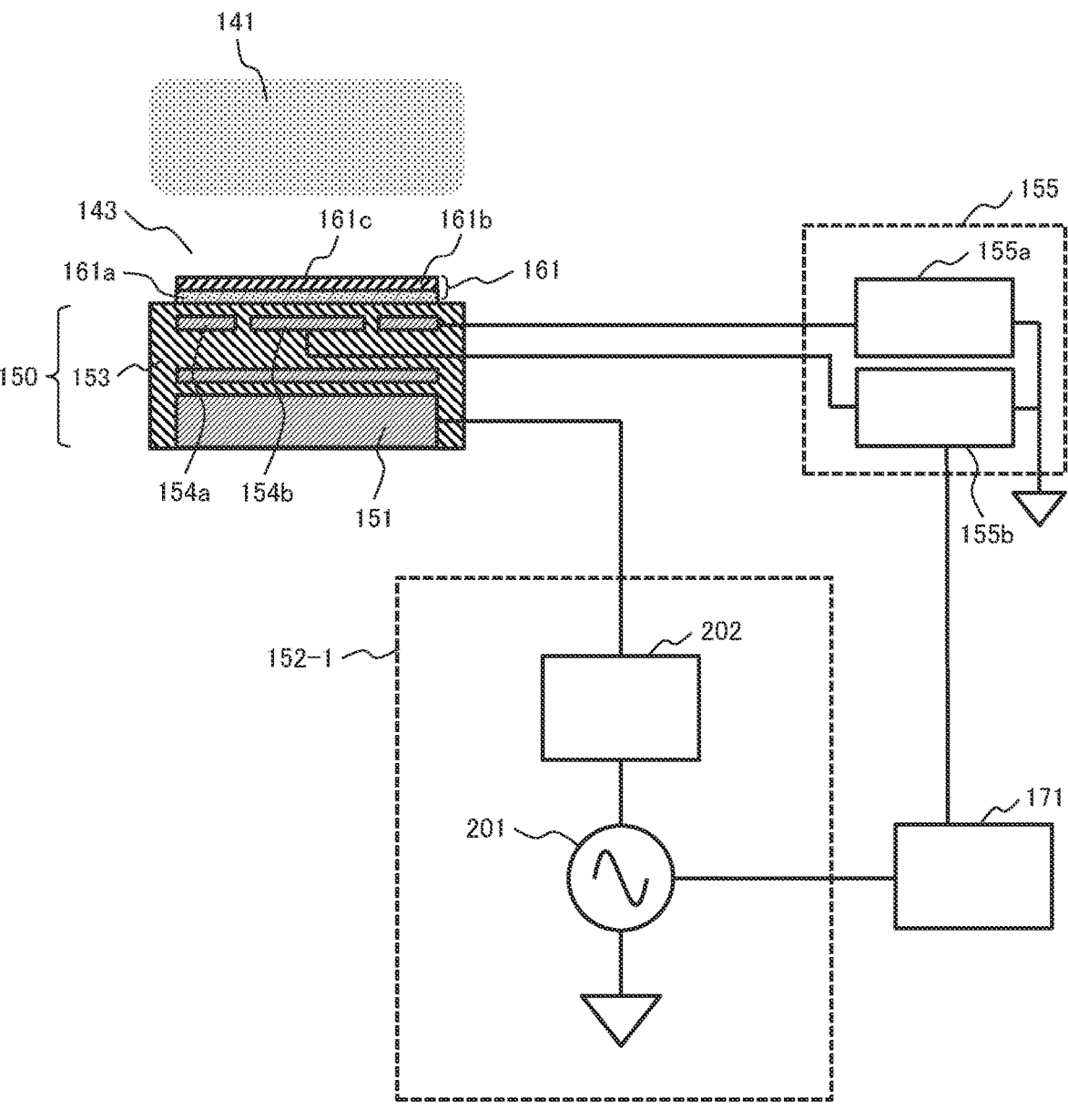
FIG. 10 is a cross sectional view of an electrode 151 and a detailed block diagram illustrating a bias voltage generator 152-1 and an electrostatic chuck power supply 155 in Modification 2 according to the present invention.
Figure 11:
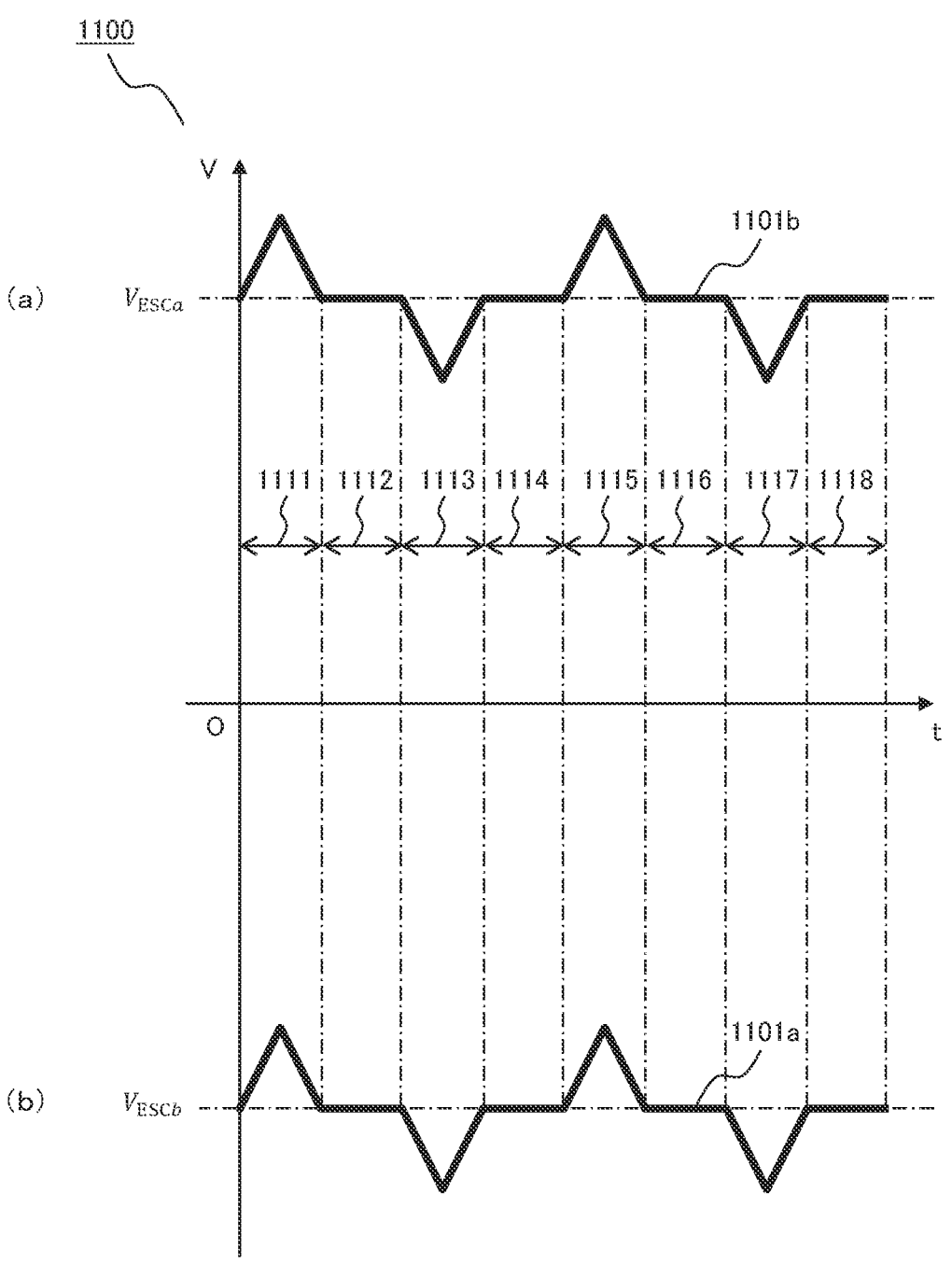
FIG. 11 is a voltage waveform diagram illustrating an output voltage waveform of the electrostatic chuck power supply 155 in Modification 2 according to the present invention.

With reference to FIG. 10 and FIG. 11, a second modification of examples according to the present invention is described. FIG. 10 is a cross sectional view of the sample stage 150 and a detailed block diagram illustrating a bias voltage generator 152-1 and the electrostatic chuck power supply 155 in Modification 2. The bias voltage generator 152-1 is identical to the bias voltage generator 152 in the example in that the high frequency power supply 201 and the automatic matching device 202 are included, but differs in that the DC power supply 203 and the lowpass filter 204 are not included.

In Modification 2, the bias voltage generator 152-1 is connected to the electrode 151, and the electrostatic chuck power supply 155 is connected to the electrostatic chuck electrodes 154a and 154b. The bias voltage generator 152-1 and the electrostatic chuck power supply 155 are controlled by the control unit 171.

FIG. 11 illustrates an output voltage waveform of the electrostatic chuck power supply 155, in which a voltage waveform 1101a in (b) represents an output voltage of the power supply unit 155a, while a voltage waveform 1101b in (a) represents an output voltage of the power supply unit 155b. In case that the voltages $V_{ESCa}$, $V_{ESCb}$ are respectively applied to the electrostatic chuck electrodes 154a and 154b in the example illustrated in FIG. 1, the voltage waveform 1101a in (b) is obtained by adding $V_{ESCa}$ to the intermittent triangular wave voltage 401 described in the example with reference to FIG. 4. The voltage waveform 1101b in (a) is obtained by subtracting ($V_{ESCa}$−$V_{ESCb}$) from the voltage waveform 1101a.

Specifically, a voltage waveform of time domain 1111, 1115 of the voltage waveforms 1101a and 1101b in the intermittent triangular wave form corresponds to the voltage waveform of the time domain 402 portion of the intermittent triangular wave voltage 401 illustrated in FIG. 4. A constant voltage section in time domain 1112, 1116 corresponds to the time domain 403 portion of the intermittent triangular wave voltage 401. Further, a voltage waveform of time domain 1113, 1117 of the voltage waveforms 1101a and 1101b in the intermittent triangular wave form corresponds to the voltage waveform of the time domain 404 portion of the intermittent triangular wave voltage 401 illustrated in FIG. 4. A constant voltage section in time domain 1114, 1118 corresponds to the time domain 405 portion of the intermittent triangular wave voltage 401.

It is noted that the voltage waveform 1101a may be obtained by adding $V_{ESCa}$ to the intermittent triangular wave voltage 701 described using FIG. 7, the voltage waveform 810, or the voltage waveform 820 described using FIG. 8 in the example as alternatives to the intermittent triangular wave voltage 401.

In Modification 2, $V_0$ used in the calculation for amplitudes of the intermittent triangular wave voltage 401, the intermittent triangular wave voltage 701, the voltage waveform 810, and the voltage waveform 820 is different from $V_0$ for the triangular wave voltage 411 in the example illustrated in FIG. 1. This is because a difference in application position of linear triangular wave between the example illustrated in FIG. 1 and Modification 2 yields a difference in voltage most suitable to remove the charged particles from the wafer 161.

The advantageous effects equivalent to those in the examples may also be provided in Modification 2. Specifically, the wafer 161 may benefit from the effect of more rapidly removing the charged particles while the amount of charged particles removed from the wafer surface per unit time is maintained at an optimum value. Therefore, the plasma processing apparatus may be provided which is capable of inhibiting the shape damage caused by the electron shading effect to be less than a conventional one.

In the modification, the plasma processing may also be performed on the wafer while more rapidly removing the charged particles with the amount of charged particles removed from the wafer surface per unit time remaining maintained at an optimum value. Therefore, the plasma processing method may be provided which reduces the shape damage caused by the electron shading effect to be less than a conventional one.

Modification 3

Figure 12:
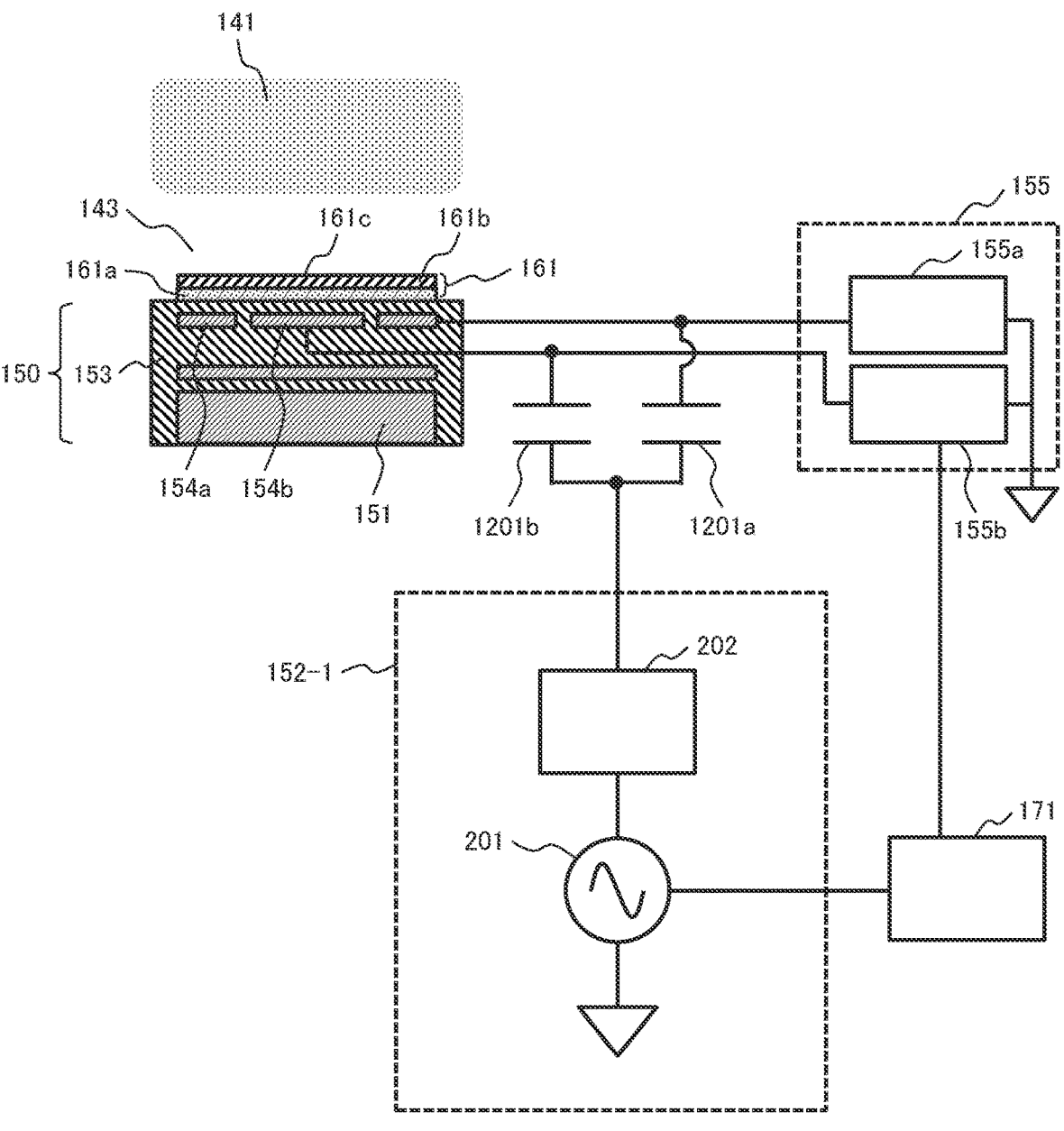
FIG. 12 is a cross sectional view of an electrode 151 and a detailed block diagram illustrating a bias voltage generator 152-1 and an electrostatic chuck power supply 155 in Modification 3 according to the present invention.

With reference to FIG. 12, a third modification of examples according to the present invention is described. In Modification 3, the bias voltage generator 152-1 including the high frequency power supply 201 and the automatic matching device 202 described in Modification 2 is configured to be connected to the electrostatic chuck electrodes 154a and 154b via capacitors 1201a and 12-1b as in the case of Modification 1, instead of being connected to the electrode 151 of the sample stage 150.

In the configuration as illustrated in FIG. 12, as described in Modification 2 with reference to FIG. 11, the electrostatic chuck power supply 155 is controlled by the control unit 171 so that the power supply unit 155a outputs the voltage waveform 1101a as illustrated in (b) to the electrostatic chuck electrode 154a, and the power supply unit 155b outputs the voltage waveform 1101a illustrated in (a) to the electrostatic chuck electrode 154b. Thereby, if voltages $V_{ESCa}$, $V_{ESCb}$ are respectively applied to the electrostatic chuck electrodes 154a and 154b in the example illustrated in FIG. 1, the voltage waveform 1101a in (b) is obtained by adding $V_{ESCa}$ to the intermittent triangular wave voltage 401 described in the example with reference to FIG. 4. The voltage waveform 1101b in (a) is obtained by subtracting $(V_{ESCa}-V_{ESCb})$ from the voltage waveform 1101a.

The advantageous effects equivalent to those in the examples may also be provided in Modification 3. Specifically, the wafer 161 may benefit from the effect of more rapidly removing the charged particles while the amount of charged particles removed from the wafer surface per unit time is maintained at an optimum value.

Therefore, the plasma processing apparatus may be provided which is capable of inhibiting the shape damage caused by the electron shading effect to be less than a conventional one.

In the modification, the plasma processing may also be performed on the wafer while the charged particles are removed more rapidly with the amount of charged particles removed from the wafer surface remaining maintained at an optimum value. Therefore, the plasma processing method may be provided which reduces the shape damage caused by the electron shading effect to be less than a conventional one.

Although the invention achieved by the inventors has been described in detail based on embodiments, the present invention is not limited to the above embodiments and embraces various modifications. For example, the above embodiments have been described in detail for the purpose of providing a better understanding of the present invention, and the present invention is not necessarily limited to including all the components and configurations described above.

It is also to be understood that a portion of the configuration of one embodiment may be substituted for a configuration of another embodiment, and a configuration of one embodiment may be added to a configuration of another embodiment. Further, to the configuration of each embodiment, another configuration may be added, or alternatively a portion of the configuration may be omitted and/or substituted. It is to be understood that each member and a relative size shown in the drawings are simplified and/or ideally depicted for the purpose of providing a better understanding of the present invention, and geometries may be complex in terms of implementation.

It is to be understood that the structure and methods described in the above embodiments are not limited to those in the above embodiments and include various example applications.

REFERENCE SIGNS LIST

100 . . . plasma processing apparatus,
101 . . . vacuum processing chamber,
121 . . . microwave power supply,
150 . . . sample stage,
151 . . . electrode,
152, 152-1 . . . bias voltage generator,
153 . . . dielectric film,
154 . . . electrostatic chuck electrode,
155 . . . electrostatic chuck power supply,
155a, 155b . . . power unit,
171 . . . control unit,
201 . . . high frequency power supply,
203 . . . DC power supply.

The invention claimed is:

1. A plasma processing apparatus, comprising:
a processing chamber in which a sample undergoes plasma processing;
a first high frequency power supply that supplies high frequency power for plasma generation;
a sample stage on which the sample is loaded;
a second high frequency power supply that supplies high frequency power to the sample stage;
a power supply that applies voltage to the sample stage; and
a control unit that controls the power supply,
wherein a cycle of a waveform of the voltage has a positive ramp period during which the voltage rises, a negative ramp period during which the voltage falls, and a removal amount control period during which an amount of charged particles removed from the sample per unit time is controlled, wherein in a case that a value obtained by multiplying an amplitude of a desired voltage waveform by a factor of a is defined as an amplitude for the positive ramp period or an amplitude for the negative ramp period, time during the removal amount control period is time having a value obtained by multiplying a sum of time during the positive ramp period and time during the negative ramp period by a value of the a minus one, and the desired voltage waveform is a voltage waveform desired for removing the charged particles in case that a voltage waveform does not have the removal amount control period.

2. The plasma processing apparatus according to claim 1, wherein the sample stage is equipped with a first electrode for electrostatically holding the sample loaded thereon and a second electrode which is different from the first electrode, and a high frequency voltage from the second high frequency power supply and the voltage are applied to the second electrode.

3. The plasma processing apparatus according to claim 1, wherein the sample stage is equipped with a first electrode for electrostatically holding the sample loaded thereon and a second electrode which is different from the first electrode, and a high frequency voltage from the second high frequency power supply and the voltage are applied to the first electrode.

4. The plasma processing apparatus according to claim 1, wherein the sample stage is equipped with a first electrode for electrostatically holding the sample loaded thereon and a second electrode which is different from the first electrode, a high frequency voltage from the second high frequency power supply is applied to the second electrode, and the voltage is applied to the first electrode.

5. The plasma processing apparatus according to claim 1, wherein the sample stage is equipped with a first electrode for electrostatically holding the sample loaded thereon and a second electrode which is different from the first electrode, and the power supply applies a voltage to the first electrode.

6. A plasma processing apparatus, comprising:

a processing chamber in which a sample undergoes plasma processing;

a first high frequency power supply that supplies high frequency power for plasma generation;

a sample stage on which the sample is loaded;

a second high frequency power supply that supplies high frequency power to the sample stage;

a power supply that applies voltage to the sample stage; and a control unit that controls the power supply, wherein a cycle of a waveform of the voltage has a positive ramp period during which the voltage rises, a negative ramp period during which the voltage falls, and a removal amount control period during which an amount of charged particles removed from the sample per unit time is controlled, wherein the voltage in the removal amount control period is nearly unchanged, wherein in a case that a value obtained by multiplying an amplitude of a desired voltage waveform by a factor of a is defined as an amplitude for the positive ramp period or an amplitude for the negative ramp period, time during the removal amount control period is time having a value obtained by multiplying a sum of time during the positive ramp period and time during the negative ramp period by a value of the a minus one, and the desired voltage waveform is a voltage waveform desired for removing the charged particles in case that a voltage waveform does not have the removal amount control period.

7. The plasma processing apparatus according to claim 6, wherein the removal amount control period is a period following the positive ramp period.

8. The plasma processing apparatus according to claim 6, wherein the removal amount control period is a period following the negative ramp period.

9. A plasma processing method for performing plasma processing on a sample, comprising a step of performing plasma processing on the sample while voltage and high frequency voltage are applied to a sample stage on which the sample is loaded, wherein a cycle of a waveform of the volage has a positive ramp period during which the voltage rises, a negative ramp period during which the voltage falls, and a removal amount control period during which the amount of charged particles removed from the sample per unit time is controlled, wherein in a case that a value obtained by multiplying an amplitude of a desired voltage waveform by a factor of a is defined as an amplitude for the positive ramp period or an amplitude for the negative ramp period, time during the removal amount control period is time having a value obtained by multiplying a sum of time during the positive ramp period and time during the negative ramp period by a value of the a minus one, and the desired voltage waveform is a voltage waveform desired for removing the charged particles in case that a voltage waveform does not have the removal amount control period.

10. The plasma processing method according to claim 9, wherein the voltage in the removal amount control period is nearly unchanged.

* * * * *